United States Patent
Su et al.

[11] Patent Number: 5,942,946
[45] Date of Patent: Aug. 24, 1999

[54] RF POWER AMPLIFIER WITH HIGH EFFICIENCY AND A WIDE RANGE OF GAIN CONTROL

[75] Inventors: Keng-Li Su; Kuang-Chung Tao, both of Hsinchu, Taiwan

[73] Assignee: Industrial Technology Research Institute, Hsinchu, Taiwan

[21] Appl. No.: 08/949,079

[22] Filed: Oct. 10, 1997

[51] Int. Cl.[6] .................................. H03F 3/68; H03G 3/30
[52] U.S. Cl. ............................................. 330/310; 330/285
[58] Field of Search ................................. 330/277, 296, 330/297, 310, 285, 133, 134

[56] References Cited

U.S. PATENT DOCUMENTS

| | | | |
|---|---|---|---|
| 3,454,892 | 7/1969 | Knowles | 330/285 |
| 4,075,576 | 2/1978 | Eden | 330/277 |
| 4,268,797 | 5/1981 | Buck | 330/277 |

*Primary Examiner*—Robert Pascal
*Assistant Examiner*—Patricia Nguyen
*Attorney, Agent, or Firm*—Ladas & Parry

[57] ABSTRACT

A RF power amplifier with the advantages of high output efficiency and a wide range of gain control is disclosed. By appropriately biasing the power transistor of the power-stage amplifier in the RF power amplifier, the power-stage amplifier functions as a class C amplifier. By varying the bias source of the driving-stage amplifier and keeping the bias sources of the input-stage and power-stage amplifiers at a fixed level, the driving-stage can output a driving signal with a wide range of variable gain. Consequently, the driving signal can be used to drive the power-stage amplifier to obtain highly efficient output and of a wide range of output power gain control.

4 Claims, 5 Drawing Sheets

RF POWER AMPLIFIER WITH HIGH EFFICIENCY AND A WIDE RANGE OF GAIN CONTROL

BACKGROUND OF THE INVENTION

1. Field of the Invention

The present invention relates to a radio-frequency power amplifier (RF power amplifier hereinafter), and more particularly, to a RF power amplifier with high output efficiency and a wide range of gain control.

2. Description of the Related Art

In general, RF power amplifiers are used in wireless communication systems to amplify and transmit signals. High efficiency and output power are the necessary requirements of RF power amplifiers. Furthermore, in order to be appropriate for various communicating distances at different occasions, the RF power amplifier must be able to provide a wide range of gain control such that the output power can be adaptively controlled according to the communicating distance, thereby reducing unnecessary output power consumption.

At present, the various methods for controlling RF power amplifiers applied in monolithic microwave integrated circuits (MMIC) include: (1) a power-synthesizing method, (2) a power-attenuating method, (3) the unbalanced bias cascode (UBIC) method, (4) a drain voltage controlling method, and (5) a gate voltage controlling method. The drawbacks of the above five methods are described as follows.

(1) With the power-synthesizing method, a plurality of power synthesizers (or power amplifiers) is combined to achieve output power control. However, giving the relatively high cost of the synthesizers, the number of the synthesizers always is restricted to reduce the cost, thereby reducing the possible options for the output power level. In addition, the control circuits are very complicated.

(2) With the power-attenuating method, power attenuators are disposed in the RF output circuits to directly attenuate the output power, thereby achieving output power control. However, it is very difficult to design attenuators with a wide range of power-attenuating capacity, low power consumption, and lower cost for MMIC applications.

(3) With the UBIC method, a common-source FET (field-effect transistor) and a common-gate FET are cascoded (connected in series) to serve as an amplifying stage, and a plurality of amplifying stages are cascoded to work as a power amplifier. By varying the gate voltages at the gate of the common-gate FETs, the drain currents of the common-source FETs are varied in response, thereby achieving output power control. However, the control circuits applied in the UBIC method are complicated and costly. In addition, the amplifiers are vulnerable to oscillation and instability, because impedance matching between amplifying stages is very difficult.

(4) With the drain-voltage control method, a source-control transistor is added to the source input of the RF power transistor, and the drain current of the RF power transistor can be adjusted by varying the gate voltage of the RF power transistor, thereby achieving output power control. However, the fabrication cost is very high.

(5) The gate-voltage control method will be described as follows, with reference to FIG. 1.

In the case of the gate-voltage control method, the RF power amplifier comprises an input-stage amplifier, an intermediate-stage (or driving-stage) amplifier, and a power-stage amplifier. The above three amplifiers are serially connected. The above three stage amplifiers consist of RF power transistors Q1, Q2, Q3 with bias circuits respectively. The bias sources Vg1, Vg2, Vg3 are used to bias the gates of the power transistors Q1, Q2, and Q3 to adjust the operating point of the power transistors Q1, Q2, and Q3 respectively. General speaking, the input-stage amplifier functions in class A or Class AB mode by adjusting the operating point of the RF power transistor Q1. The input-stage amplifier is used to first amplify the input signal $RF_{in}$. The power-stage amplifier always functions in Class AB mode by adjusting the operating point of the RF power transistor Q3. By varying the gate biases of the transistors Q1, Q2, and Q3, the amplification ratios of the three amplifier stages can be adjusted, and therefore the RF power amplifier can amplify the input signal $RF_{in}$ to the expected power level.

The gate-voltage control method is simple, but there are still some drawbacks. Because the gate voltage Vgs of the RF power transistor only has a narrow voltage control range, a wide range of gain control and precise output power control are very difficult to achieve. Furthermore, the power-stage amplifier functions in class AB mode, and thus it is always in the turned-on state. Consequently, a great deal of power is dissipated by the power-stage amplifier. Furthermore, because the power-stage amplifier is always in the turned-on state, the noise generated between every amplifier stage is amplified and output.

SUMMARY OF THE INVENTION

In view of the above problems, the present invention provides a RF power amplifier with high efficiency and a wide gain control range. According to the present invention, the power transistor of the power-stage amplifier in the RF power amplifier is well biased, such that the power-stage amplifier can function in class C mode. Further, by varying the gate voltage of the power transistor in the driving-stage amplifier, the driving-stage amplifier can output a control signal with a wide range of variation. Through using the control signal, the Class C power-stage amplifier can be driven directly, such that the RF power amplifier can achieve high efficiency, a wide gain control range, high stability, a highly linear fine-increment level of control, and low power dissipation.

In order to achieve the above objects, a RF power amplifier with high efficiency and a wide range of gain control is disclosed. The RF power amplifier according to the present invention comprises the devices described as follows.

(1) A first-stage amplifier comprises a first power transistor, a first bias circuit, and a first bias source. The drain and source of the first power transistor are coupled to a voltage source node and a ground reference node respectively. The first bias source with a fixed voltage level is fed to the gate of the first power transistor via said first bias circuit, thereby allowing said first-stage amplifier to function as a class A or a class AB amplifier. An input signal coupled to the gate of said first power transistor is amplified and then output at the drain of said first power transistor.

(2) A second-stage amplifier comprises a second power transistor, a second bias circuit, and a second bias source. The drain and source of the second power transistor are coupled to the voltage source node and the ground reference node respectively. The second bias source is fed to the gate of the second power transistor via the second bias circuit. Therefore, the turn-on drain current of the second power transistor can be adjusted by varying the voltage of the second bias source to achieve output power control. Further, the output signal of the first-stage amplifier coupled to the gate of the second-stage power transistor is amplified by the second-stage amplifier and then output at the drain of the second power transistor.

(3) A third-stage amplifier comprises a third power transistor, a third bias circuit, and a third bias source. The drain and source of the third power transistor are coupled to a voltage source node and a ground reference node respectively. The third bias source with a fixed voltage level is fed to the gate of the third power transistor via the third bias circuit, thereby allowing the third-stage amplifier to function as a class C amplifier. Further, the output signal of the second-stage amplifier coupled to the gate of the third-stage power transistor is amplified by said third-stage amplifier and then output at the drain of the third power transistor.

Furthermore, the second-stage amplifier further comprises a level control circuit which is coupled to the gate of the second power transistor, such that the turn-on drain current of said second power transistor can be finely adjusted.

BRIEF DESCRIPTION OF THE DRAWINGS

Other objects, features and advantages of the present invention will become apparent by way of the following detailed description of the preferred but non-limiting embodiments. Description is made with reference to the accompanying drawings.

DETAILED DESCRIPTION OF THE INVENTION

Preferred Embodiment

Figure 1:
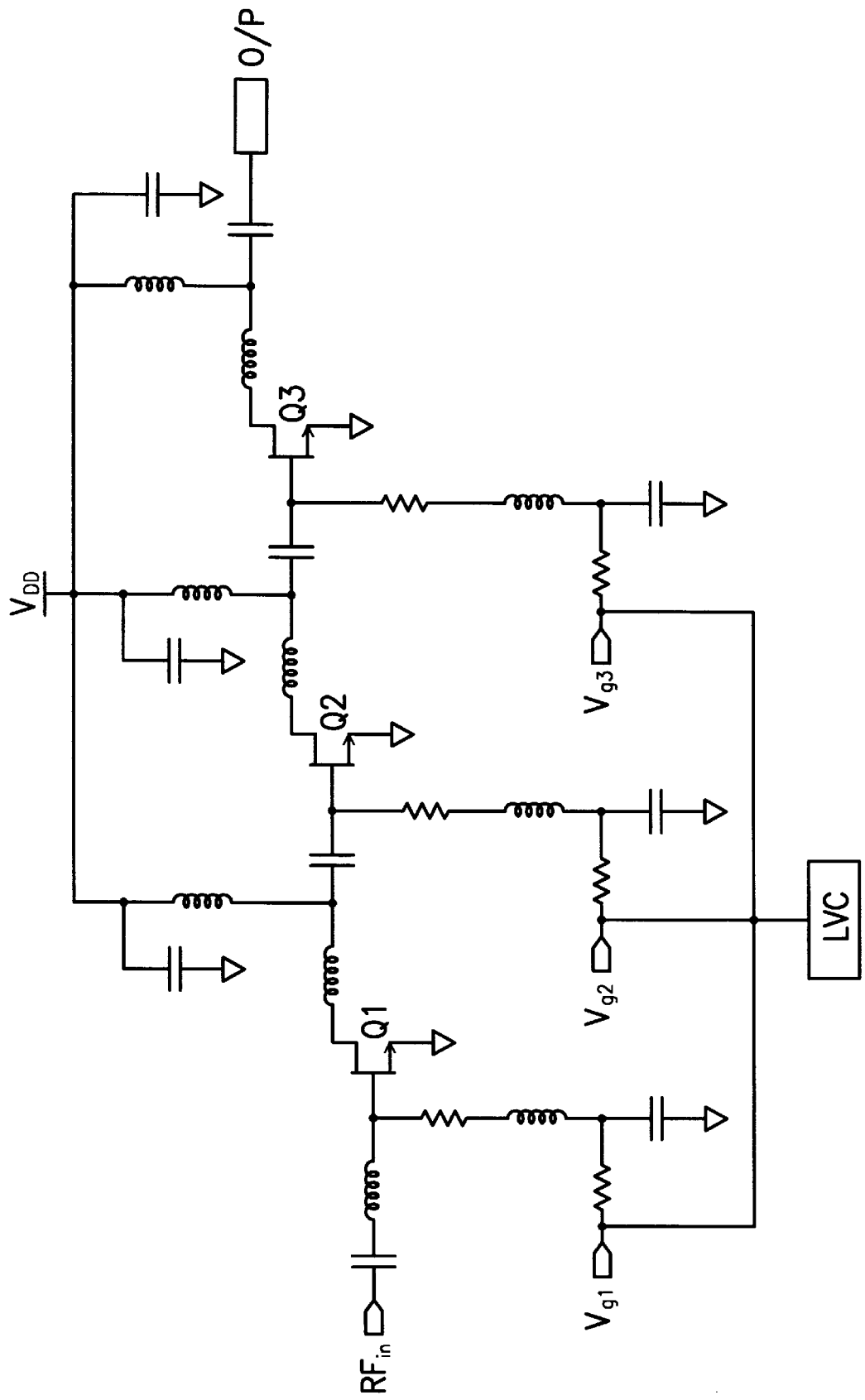
FIG. 1 schematically depicts a circuit diagram of a conventional RF power amplifier using the gate-voltage control method.
Figure 2:
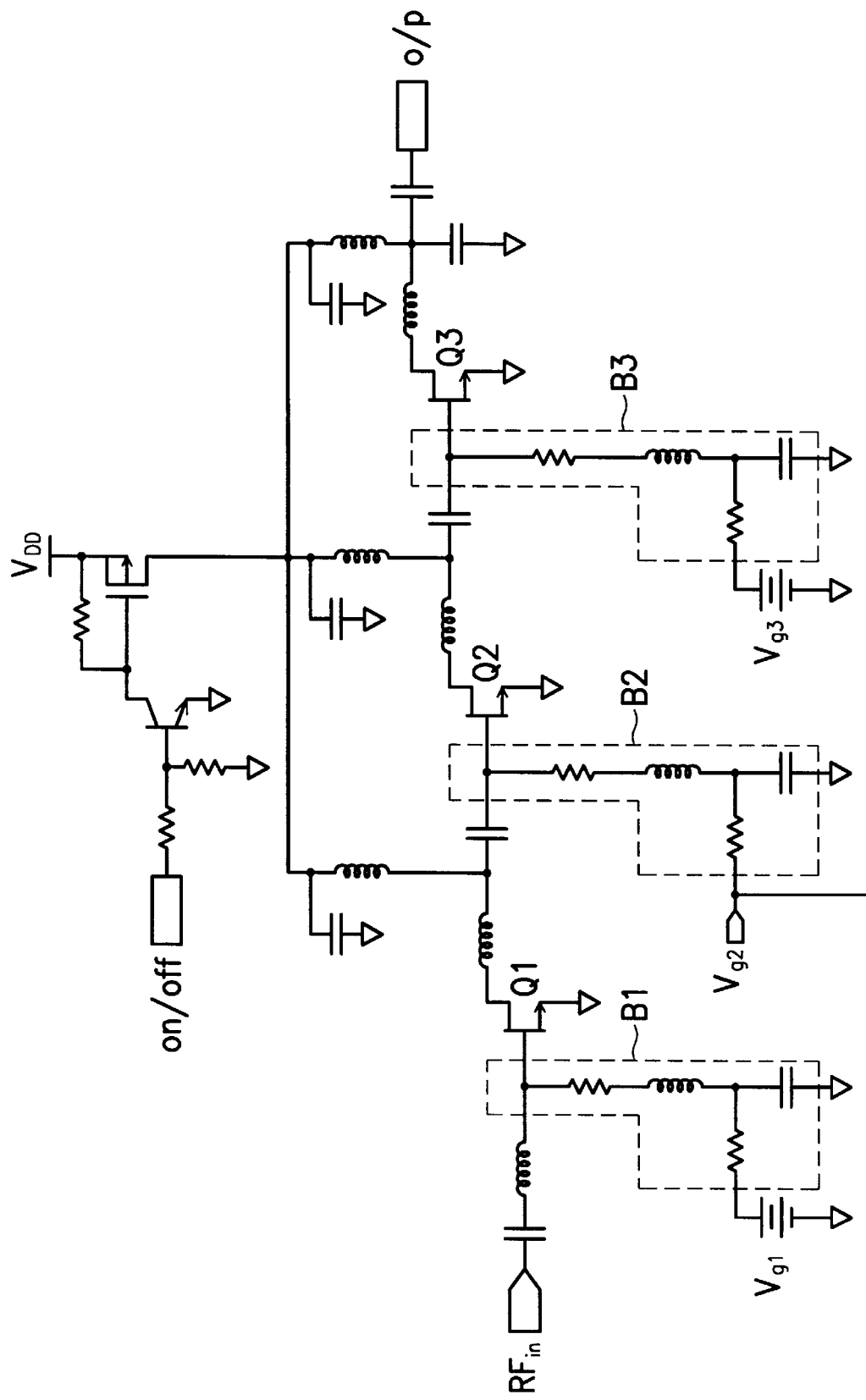
FIG. 2 schematically depicts a circuit diagram of a preferred embodiment of a RF power amplifier according to the present invention.

FIG. 2 schematically depicts a circuit diagram of a preferred embodiment of a RF power amplifier according to the present invention. The RF power amplifier according to the present invention consists of a first-stage amplifier I, a second-stage amplifier II, and a third-stage amplifier III, which will be detailed described hereinafter, with reference to FIG. 2.

(1) The first-stage amplifier I comprises a first power transistor Q1, a first bias circuit B1, and a first bias source Vg1. The first power transistor Q1 can be a field-effect transistor (JFET or MOSFET), and in this embodiment, an n-channel JFET is applied. Through a conducting path, the drain and source of the first power transistor are coupled to a voltage source node $V_{DD}$ and a ground reference node respectively. The first bias source Vg1 with a fixed voltage level is fed to the gate of the first power transistor Q1 via the first bias circuit B1. In this embodiment, the voltage level of the bias source Vg1 is about −0.55 V. The gate of the operating point of the JFET Q1 is biased by Vg1 (−0.55 V), such that the first-stage amplifier functions as a class A or a class AB amplifier. An input signal $RF_{in}$ coupled to the gate of said first power transistor (JFET) Q1 is amplified and then output at the drain of said first power transistor (JFET) Q1.

(2) The second-stage amplifier II comprises a second power transistor Q2, a second bias circuit B2, and a second bias source Vg2. The second power transistor Q2 also can be a field-effect transistor (JFET or MOSFET), and in this embodiment, an n-channel JFET is applied, for example. For the same way, through a conducting path, the drain and source of the second power transistor Q2 are coupled to the voltage source node $V_{DD}$ and a ground reference node respectively. The second bias source Vg2 is fed to the gate of the second power transistor Q2 via the second bias circuit B2. Therefore, the turn-on drain current of the second power transistor Q2 can be adjusted by varying the voltage level of the second bias source Vg2 to change the amplification ratio of the second-stage amplifier, thus achieving output power control. Further, the output signal of the first-stage amplifier I coupled to the gate of the second-stage power transistor Q2 is amplified by the second-stage amplifier II and then output at the drain of the second power transistor Q2.

In the second-stage amplifier II, a level control circuit (LVC hereinafter) is further comprised. The LVC receives an input voltage of between 3V and 0V, and emits output voltage of between 0V~−2V coupled to the second bias source Vg2. By using the LVC to finely vary the voltage at gate of the second power transistor Q2, the turn-on drain current of the second power transistor can also be finely adjusted, thus achieving a fine increment of adjustment over the output power.

(3) The third-stage amplifier III comprises a third power transistor Q3, a third bias circuit B3, and a third bias source Vg3. The third power transistor Q3 can also be a field-effect transistor (JFET or MOSFET), and in this embodiment, an n-channel JFET is applied. Through a conducting path, the drain and source of the third power transistor are coupled to the voltage source node $V_{DD}$ and the ground reference node respectively. The third bias source Vg3 with a fixed voltage level is fed to the gate of the third power transistor Q3 via the third bias circuit B3. In this embodiment, the voltage level of the bias source Vg3 is about −1.8V. The gate of the operating point of the JFET Q1 is biased by Vg3 (−1.8 V), such that the third-stage amplifier III functions as a class C amplifier. Therefore, when the third-stage amplifier III is only biased by the third source Vg3 (DC source), it is in the "OFF" state. When the third-stage amplifier III receives the output signals from the second-stage amplifier II, the third-stage amplifier III will be activated and amplifies and outputs a RF signal at the drain of the third power transistor Q3. Consequently, the power dissipated by the third-stage amplifier can be reduced, and the output noise can be reduced.

Figure 3A:
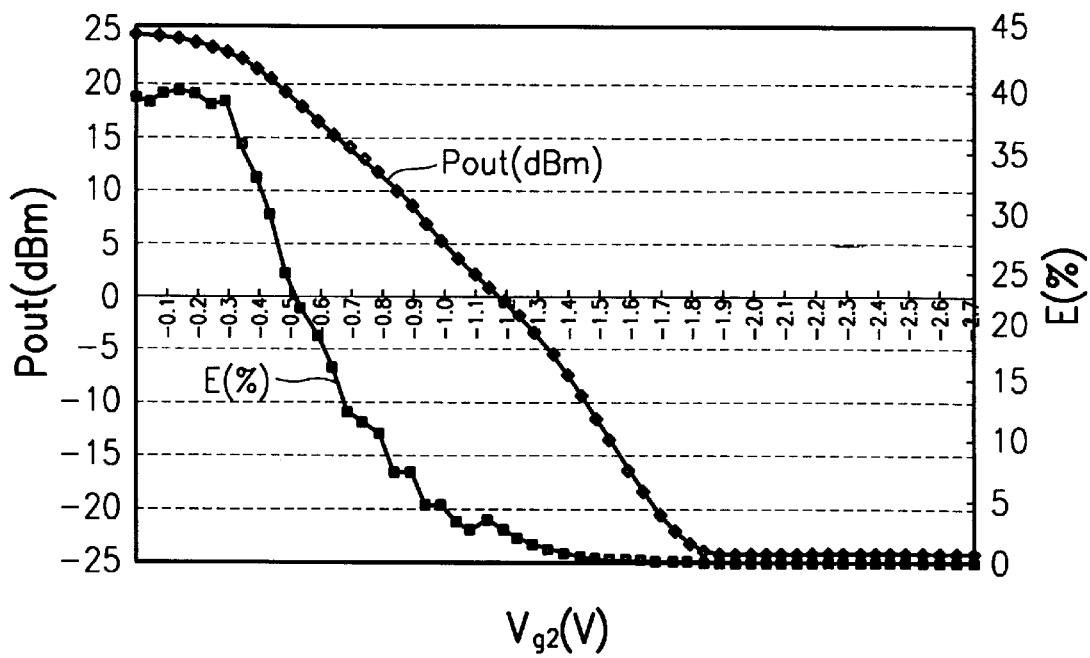
FIG. 3A depicts the relationship of output power $P_{out}$ (dBm) and the efficiency E(%) of the RF power amplifier with respect to variation of the second bias source Vg2, at 900 MHz.
Figure 3B:
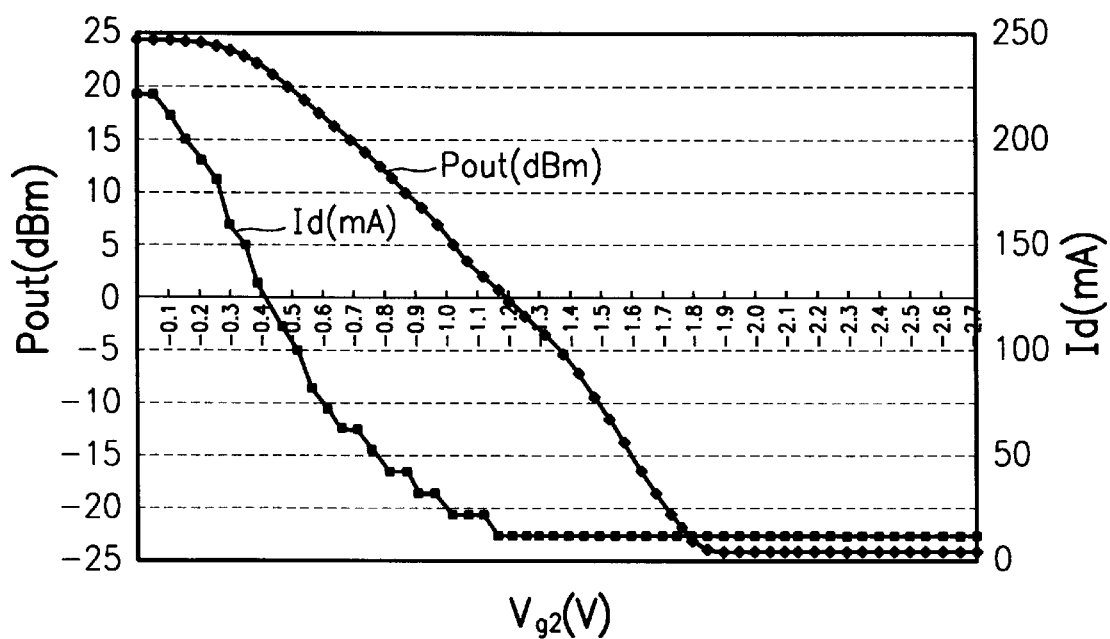
FIG. 3B depicts the relationship of the total dissipated current $I_d$(mA) with respect to variation of the second bias source Vg2, at 900 MHz.
Figure 4A:
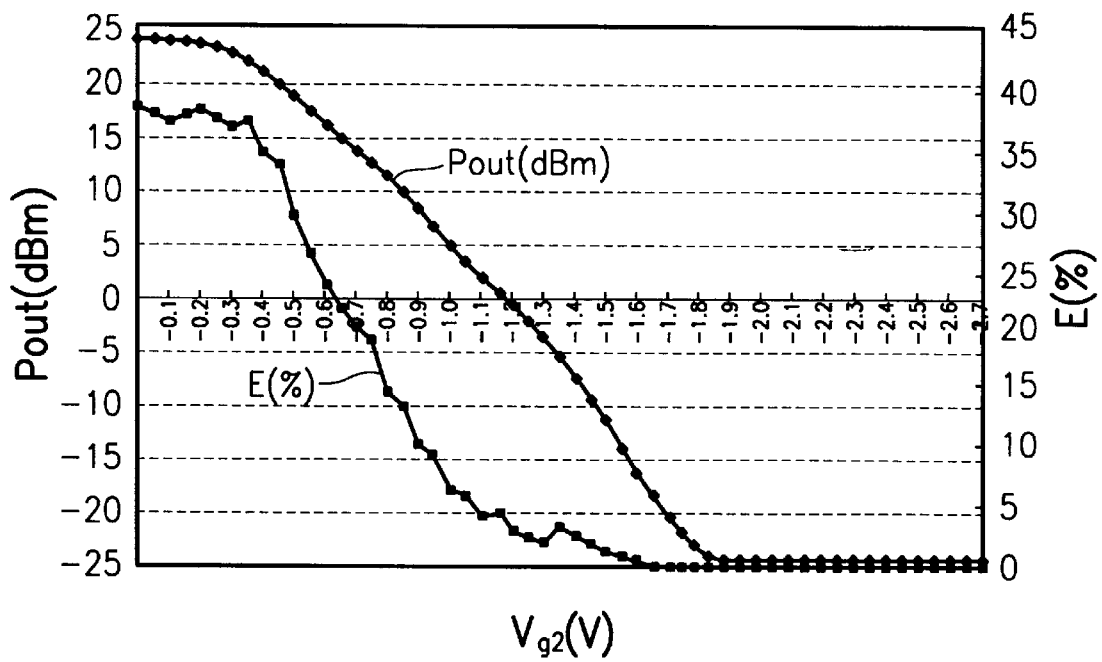
FIG. 4A depicts the relationship of the output power $P_{out}$(dBm) and the efficiency E(%) of the RF power amplifier with respect to variation of the second bias source Vg2, at 915 MHz.
Figure 4B:
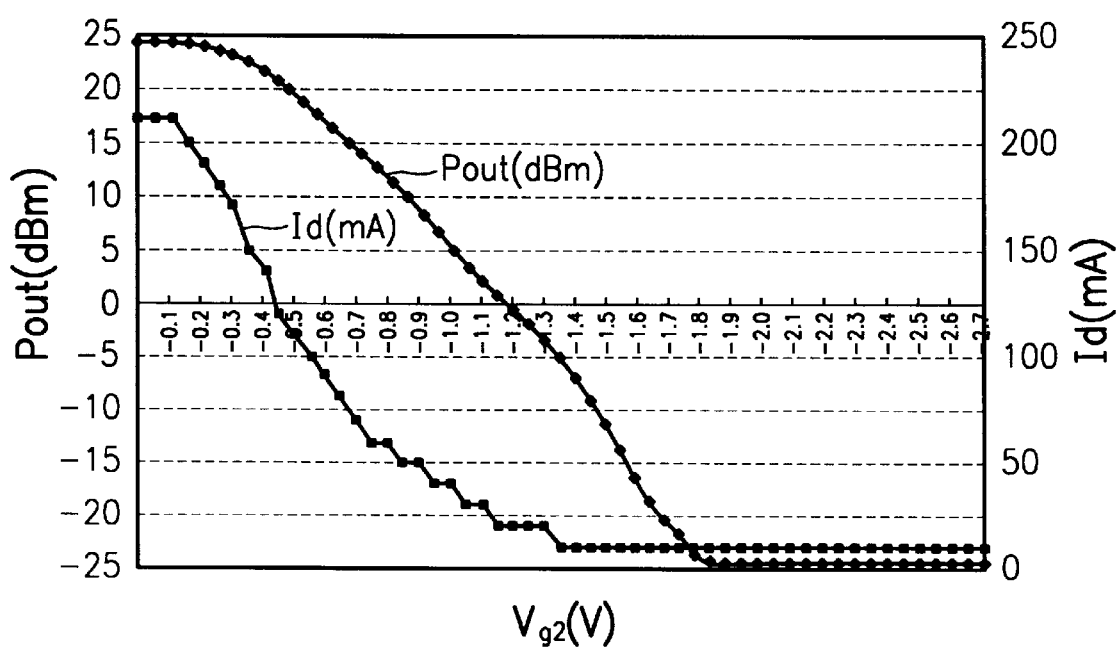
FIG. 4B depicts the relation of the total dissipated current $I_d$(mA) with respect to variation of the second bias source Vg2, at 915 MHz.
Figure 5A:
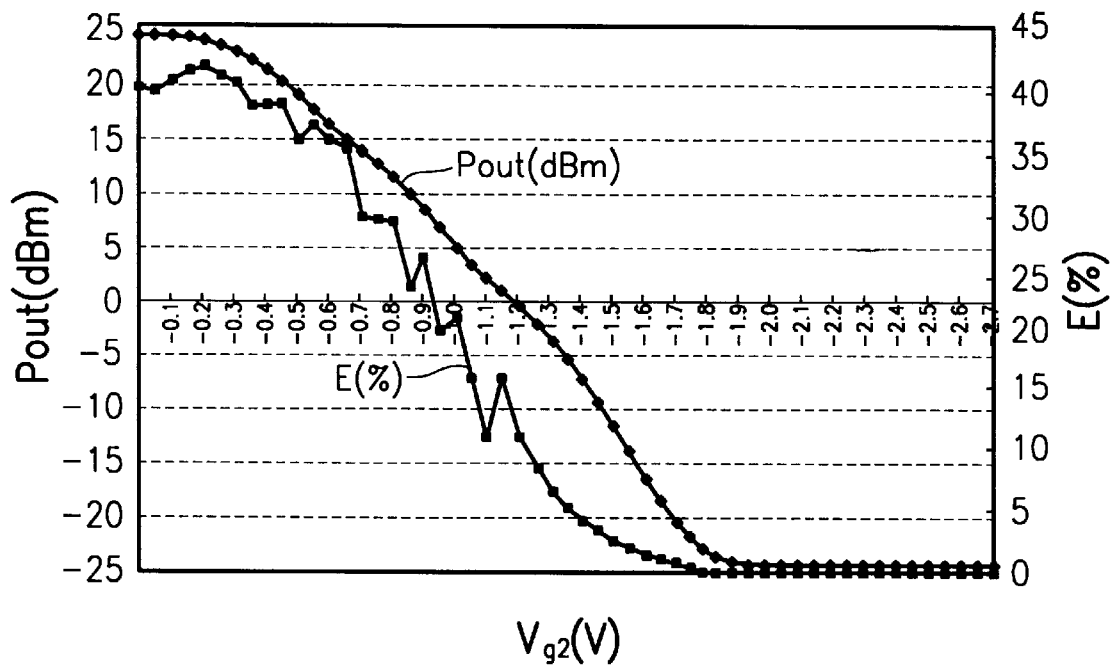
FIG. 5A depicts the relations of the output power $P_{out}$ (dBm) and the efficiency E(%) of the RF power amplifier with respect to variation of the second bias source Vg2, at 930 MHz.
Figure 5B:
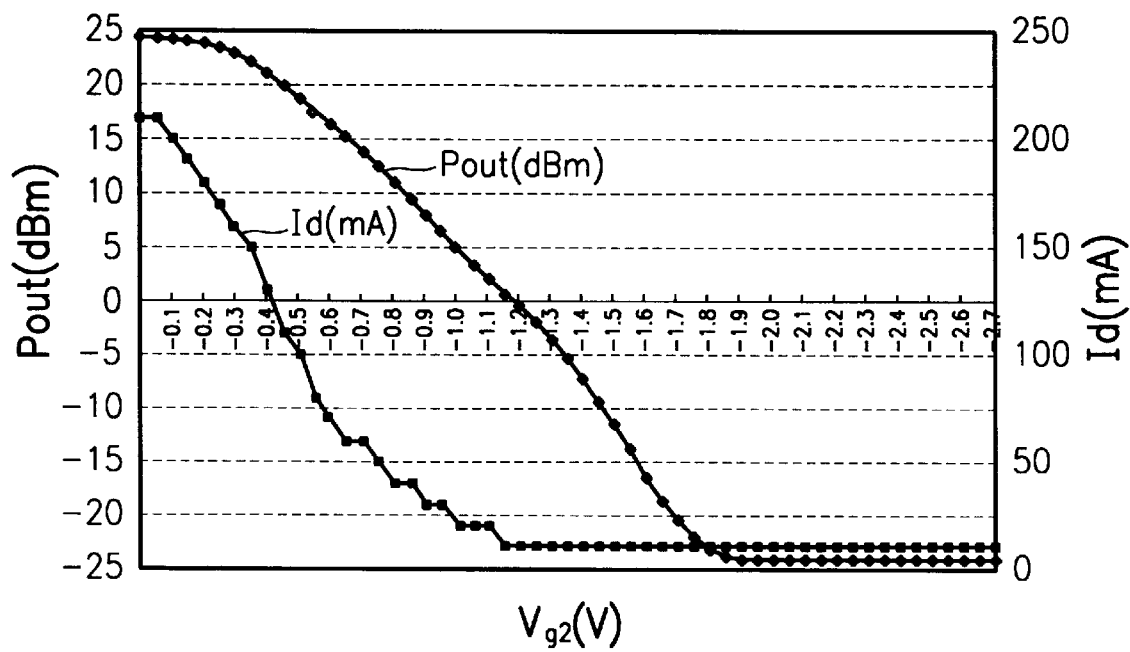
FIG. 5B depicts the relation of the total dissipated current $I_d$(mA) with respect to variation of the second bias source Vg2, at 930 MHz.

If the power of the input signal $RF_{in}$ is set at −3 dBm, the first and third bias source Vg1 and Vg3 are set at −0.55V and −1.8V respectively, and the voltage source $V_{DD}$ is 3.3V, the experiment results of the embodiment are obtained. FIG. 3A, FIG. 4A, and FIG. 5A depict the relationship of output power $P_{out}$(dBm) and the efficiency E(%) of the RF power amplifier with respect to the variations of the second bias source Vg2, at 900 MHz, 915 MHz, and 930 MHz respectively. FIG. 3B, FIG. 4B, and FIG. 5B depict the relation of the total dissipated current $I_d$(mA) with respect to the variations of the second bias source Vg2, at 900 MHz, 915 MHz, and 930 MHz respectively.

As depicted in FIG. 3A, FIG. 4A, and FIG. 5A, the output power of the RF power amplifier can be widely varied from +25 dBm to −25 dBm. The output power $P_{out}$(dBm) in response to the second bias source Vg2 has high linearity and efficiency E(%). Consequently, in the RF power amplifier according to the present invention, the second-stage (driving-stage) amplifier can output a signal with wide range variation and high power by varying the bias source Vg2. The third-stage (power-stage) amplifier, which works in class C mode, is directly driven by the output signal from the second-stage. Therefore, high efficiency, a wide range of gain control, and fine increment of power-control with high linearity can be achieved.

As depicted in FIG. 3B, FIG. 4B, and FIG. 5B, when the output power is 0 dBm (that is 1 mW), for example, the total dissipated current is less than 25 mA. Furthermore, the third-stage (power-stage) amplifier works as a class C amplifier, which is always in the "OFF" state when no input signal is received. Compared with the conventional power stage (in class AB mode), the third-stage amplifier is not always in a conducting state and will not dissipate power in standby mode, thus noise will not be amplified when there is no RF signal input.

Furthermore, the bias sources Vg1 and Vg3 are of fixed level and the bias source Vg2 is variable to control the power output. In the prior art, the bias sources are all variable, such that variation of the bias sources influence the impedance match between the amplifier stages, and therefore the RF power amplifier may oscillate and become unstable. To avoid the problems of the prior art, the circuit design must be more complicated and costly.

According to the present invention, however, only the second bias source Vg2 is variable, so impedance matching and circuit design are easier, and the RF power amplifier is more stable and less costly.

While the invention has been described in terms of what is presently considered to be the most practical and preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A RF power amplifier with high output efficiency and wide range of gain control comprising:

a first-stage amplifier which comprises a first power transistor, a first bias circuit, and a first bias source, wherein the drain and source of said first power transistor are coupled to a voltage source node and a ground reference node respectively, said first bias source with a fixed voltage level is fed to the gate of said first power transistor via said first bias circuit, thereby allowing said first-stage amplifier to function as a class A or a class AB amplifier, and an input signal coupled to the gate of said first power transistor is amplified and then output at the drain of said first power transistor;

a second-stage amplifier which comprises a second power transistor, a second bias circuit, and a second bias source, wherein the drain and source of said second power transistor are coupled to said voltage source node and said ground reference node respectively, and said second bias source is fed to the gate of said second power transistor via said second bias circuit, and the turn-on drain current of said second power transistor can be adjusted by varying the voltage of said second bias source to achieve output power control, and the output signal of said first-stage amplifier coupled to the gate of said second-stage power transistor is amplified by said second-stage amplifier and then output at the drain of said second power transistor; and a third-stage amplifier which comprises a third power transistor, a third bias circuit, and a third bias source, wherein the drain and source of said third power transistor are coupled to a voltage source node and a ground reference node respectively, and said third bias source with a fixed voltage level is fed to the gate of said third power transistor via said third bias circuit, thereby allowing said third-stage amplifier to function as a class C amplifier, and the output signal of said second-stage amplifier coupled to the gate of said third-stage power transistor is amplified by said third-stage amplifier and then output at the drain of said third power transistor.

2. A RF power amplifier as claimed in claim 1, said second-stage amplifier further comprising a level control circuit which is coupled to the gate of said second power transistor, such that the turn-on drain current of said second power transistor can be fine adjusted.

3. A RF power amplifier as claimed in claim 1, the third power transistor biased in class C mode is turned on by the output of said second-stage amplifier.

4. A RF power amplifier as claimed in claim 1, wherein said first power transistor, said second power transistor, and said third power transistor can be N-channel field-effect transistors.

* * * * *